(12) United States Patent
Watanabe (10) Patent No.: US 7,561,428 B2
(45) Date of Patent: Jul. 14, 2009

(54) INFORMATION PROCESSING APPARATUS (75) Inventor: Hayato Watanabe, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 101 days.

(21) Appl. No.: 11/808,370

(22) Filed: Jun. 8, 2007

(65) Prior Publication Data
US 2007/0291450 A1    Dec. 20, 2007

(30) Foreign Application Priority Data
Jun. 19, 2006    (JP) ............................. 2006-168418

(51) Int. Cl.
H05K 7/20    (2006.01)

(52) U.S. Cl. .................. 361/714; 361/687; 361/695; 165/80.3; 165/185

(58) Field of Classification Search ............ 361/679, 361/686–697, 702–707, 712–723, 816, 818, 361/832; 312/223.2, 223.3, 236; 165/80.3, 165/104.33, 185; 174/15.1, 16.3, 252, 50, 174/50.5, 50.51, 35 R, 35 GC
See application file for complete search history.

(56) References Cited

U.S. PATENT DOCUMENTS

| | | | | |
|---|---|---|---|---|
| 4,557,225 A * | 12/1985 | Sagues et al. ............ 123/41.31 |
| 5,278,730 A * | 1/1994 | Kikinis ..................... 361/686 |
| 5,331,509 A * | 7/1994 | Kikinis ..................... 361/686 |
| 5,426,564 A * | 6/1995 | Hsu ......................... 361/707 |
| 5,430,617 A * | 7/1995 | Hsu ......................... 361/818 |
| 5,463,742 A * | 10/1995 | Kobayashi ................. 710/303 |
| 5,537,343 A * | 7/1996 | Kikinis et al. .............. 361/687 |
| 5,550,710 A * | 8/1996 | Rahamim et al. .......... 361/687 |
| 5,552,967 A * | 9/1996 | Seto et al. ................. 361/818 |
| 5,694,294 A * | 12/1997 | Ohashi et al. ............. 361/687 |
| 5,786,984 A * | 7/1998 | Bonardi et al. ............ 361/686 |
| 5,813,243 A * | 9/1998 | Johnson et al. ........... 62/259.2 |
| 6,108,199 A * | 8/2000 | Bonardi et al. ............ 361/686 |
| 6,297,955 B1 * | 10/2001 | Frank et al. ............... 361/686 |
| 6,359,779 B1 * | 3/2002 | Frank et al. ............... 361/687 |
| 6,389,499 B1 * | 5/2002 | Frank et al. ............... 710/300 |
| 6,411,522 B1 * | 6/2002 | Frank et al. ............... 361/800 |
| 6,525,932 B1 * | 2/2003 | Ohnishi et al. ............ 361/686 |
| 6,597,569 B1 * | 7/2003 | Unrein ..................... 361/687 |
| 7,095,611 B2 * | 8/2006 | Kunz ....................... 361/687 |
| 7,209,352 B2 * | 4/2007 | Chen ....................... 361/695 |
| 7,315,447 B2 * | 1/2008 | Inoue et al. ............... 361/687 |
| 2006/0219852 A1 | 10/2006 | Kawai |
| 2006/0256515 A1 | 11/2006 | Watanabe |

FOREIGN PATENT DOCUMENTS

JP    2006-301816    11/2006

* cited by examiner

Primary Examiner—Michael V Datskovskiy
(74) Attorney, Agent, or Firm—Dickstein Shapiro LLP (57) ABSTRACT

A disclosed information processing apparatus includes a central processing unit; a substrate on which the central processing unit is mounted; a housing configured to form a space for accommodating the substrate; and a dividing member configured to divide the space into a first space for accommodating the substrate and a second space other than the first space.

10 Claims, 7 Drawing Sheets

INFORMATION PROCESSING APPARATUS

BACKGROUND OF THE INVENTION

1. Field of the Invention

The present invention relates generally to information processing apparatuses, and more particularly to an information processing apparatus provided with a CPU (central processing unit).

2. Description of the Related Art

Conventionally, in personal computers and image processing apparatuses acting as device controllers that are built into vending machines, ticket-vending machines, etc., various measures have been taken for cooling components that emit high heat such as CPUs. One typical example of a method of cooling such high-heat emitting components is a forced air cooling method of supplying cooled air to the high-heat emitting component with a cooling fan. Another typical example is a natural air cooling method where an opening is provided in a housing above the high-heat emitting component, and heat of the high-heat emitting component is exhausted outside the housing by an ascending convection current of heated air.

However, in the forced air cooling method, it is necessary to provide a cooling fan in the housing, which results in a large-sized apparatus and causes noise when the cooling fan is driven, thus making it difficult to keep the product silent. In the natural air cooling method, problems arise if the information processing apparatus is installed outdoors where the environment cannot be managed. Specifically, there may be cases where the air current of the environment in which the apparatus is installed flows counter to the ascending current from inside the housing, which obstructs the heat from being exhausted efficiently. Furthermore, foreign matter may enter through the opening, which may have adverse effects on the quality of the apparatus.

Accordingly, there is a third cooling method that is practically implemented. In this method, the high-heat emitting component is mounted on a substrate. The side of the substrate on which the high-heat emitting component is mounted is arranged close to an inner wall of the housing. Other components are mounted on the other side of the substrate. Thus, the heat emitted from the high-heat emitting component is transferred outside by using the housing as a heat sink. However, in this cooling method, the substrate needs to be fabricated separately so as to conform with the shape of the housing, and therefore, it is difficult to employ a substrate complying with the ATX specification, which is a standard in the field of computers. As a result, the cost of the apparatus increases.

SUMMARY OF THE INVENTION

The present invention provides an information processing apparatus in which one or more of the above-described disadvantages are eliminated.

A preferred embodiment of the present invention provides an information processing apparatus capable of enhancing cooling efficiencies in the apparatus without increasing the size or the cost of the apparatus.

An embodiment of the present invention provides an information processing apparatus including a central processing unit; a substrate on which the central processing unit is mounted; a housing configured to form a space for accommodating the substrate; and a dividing member configured to divide the space into a first space for accommodating the substrate and a second space other than the first space.

According to one embodiment of the present invention, an information processing apparatus is provided, which is capable of enhancing cooling efficiencies in the apparatus without providing a cooling mechanism such as a cooling fan in the housing and without increasing the size or the cost of the apparatus.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to FIGS. 1-7, of an embodiment of the present invention.

Figure 1:
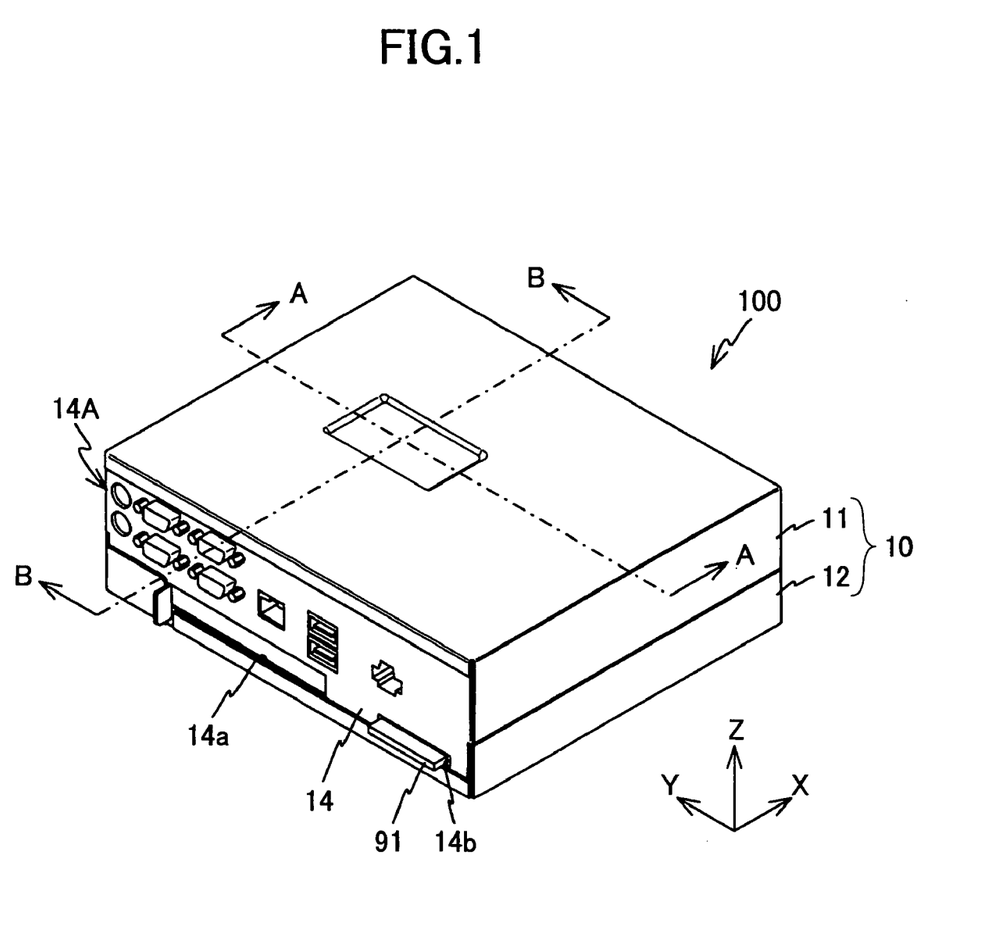
FIG. 1 is a perspective view of an information processing apparatus according to an embodiment of the present invention.
Figure 2:
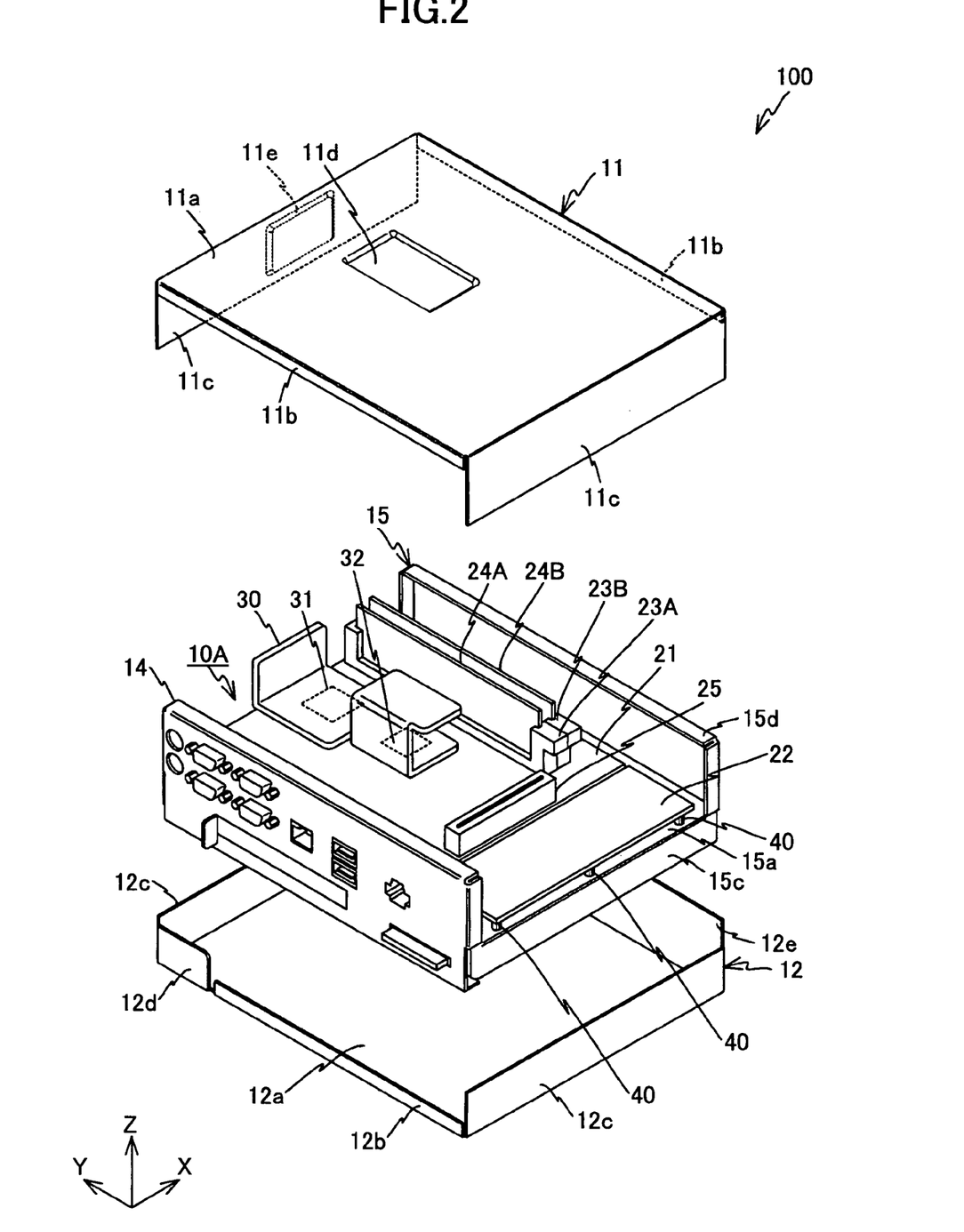
FIG. 2 is an exploded perspective view of the information processing apparatus shown in FIG. 1.

FIG. 1 is a perspective view of an information processing apparatus 100 according to an embodiment of the present invention, and FIG. 2 is an exploded perspective view of the information processing apparatus 100. The information processing apparatus 100 is built into a vending machine or a ticket-vending machine, etc. In the figures, X, Y, and Z axes respectively indicate a horizontal direction, a depthwise direction, and a vertical direction as viewed in the figures, where the arrows are pointed toward positive (+) directions. As shown in FIGS. 1 and 2, the information processing apparatus 100 includes an upper cover 11 and a lower cover 12 that fit into each other in the vertical direction; a front panel 14 provided with plural external input terminals and fixed onto the −X edges of the upper cover 11 and the lower cover 12; and a dividing member 15 that divides the space inside the upper cover 11 and the lower cover 12 into an upper space and a lower space.

The upper cover 11 is fabricated by performing sheet metal processing on an alumite-treated aluminum plate. As shown in FIG. 2, the upper cover 11 includes a substantially square-shaped top plate 11a; a pair of engaging parts 11b provided along the +X and the −X edges on the bottom face of the top plate 11a and extending lengthwise in the Y axis direction; and a pair of side walls 11c provided along the +Y and the −Y edges on the bottom face of the top plate 11a and extending lengthwise in the X axis direction. A protruding part 11d, which is provided at a position slightly shifted toward the +Y direction from the center of the top plate 11a, protrudes inward inside the upper cover 11 and extends lengthwise in the Y axis direction. A protruding part 11e, which is positioned in the center of the side wall 11c provided on the +Y side of the top plate 11a, protrudes inward inside the upper cover 11 and extends lengthwise in the X axis direction.

Similar to the upper cover 11, the lower cover 12 is fabricated by performing sheet metal processing on an alumite-treated aluminum plate, for example. The lower cover 12 includes a substantially square-shaped bottom plate 12a; a pair of side walls 12c provided along the +Y and the −Y edges on the top face of the bottom plate 12a and extending lengthwise in the X axis direction; and a back wall 12e provided along the +X edge on the top face of the bottom plate 12a and extending lengthwise in the Y axis direction. An engaging part 12b is provided along the −X edge on the top face of the bottom plate 12a, and an engaging part 12d that is higher than the engaging part 12b is provided in the +Y corner with a predetermined space between the engaging part 12d and the engaging part 12b.

The front panel 14 is a rectangular plate member extending lengthwise in the Y axis direction, which is fabricated by performing sheet metal processing on an alumite-treated aluminum plate, for example. As shown in FIG. 1, an interface 14A is provided on the outside of the front panel 14. The interface 14A includes, for example, a power supply connector, a USB terminal, a mouse terminal, a serial connector, and a LAN (local area network) adapter for electrically connecting the information processing apparatus 100 with an external device. Around the center of the −Z edge of the front panel 14, there is provided an insertion opening 14a for inserting a PCI (Peripheral Component Interconnect) card, extending lengthwise in the Y axis direction. Near the −Y end of the −Z edge of the front panel 14, there is provided an insertion opening 14b for inserting a compact flash (registered trademark) 91 (hereinafter, "CF card"), extending lengthwise in the Y axis direction.

Figure 3:
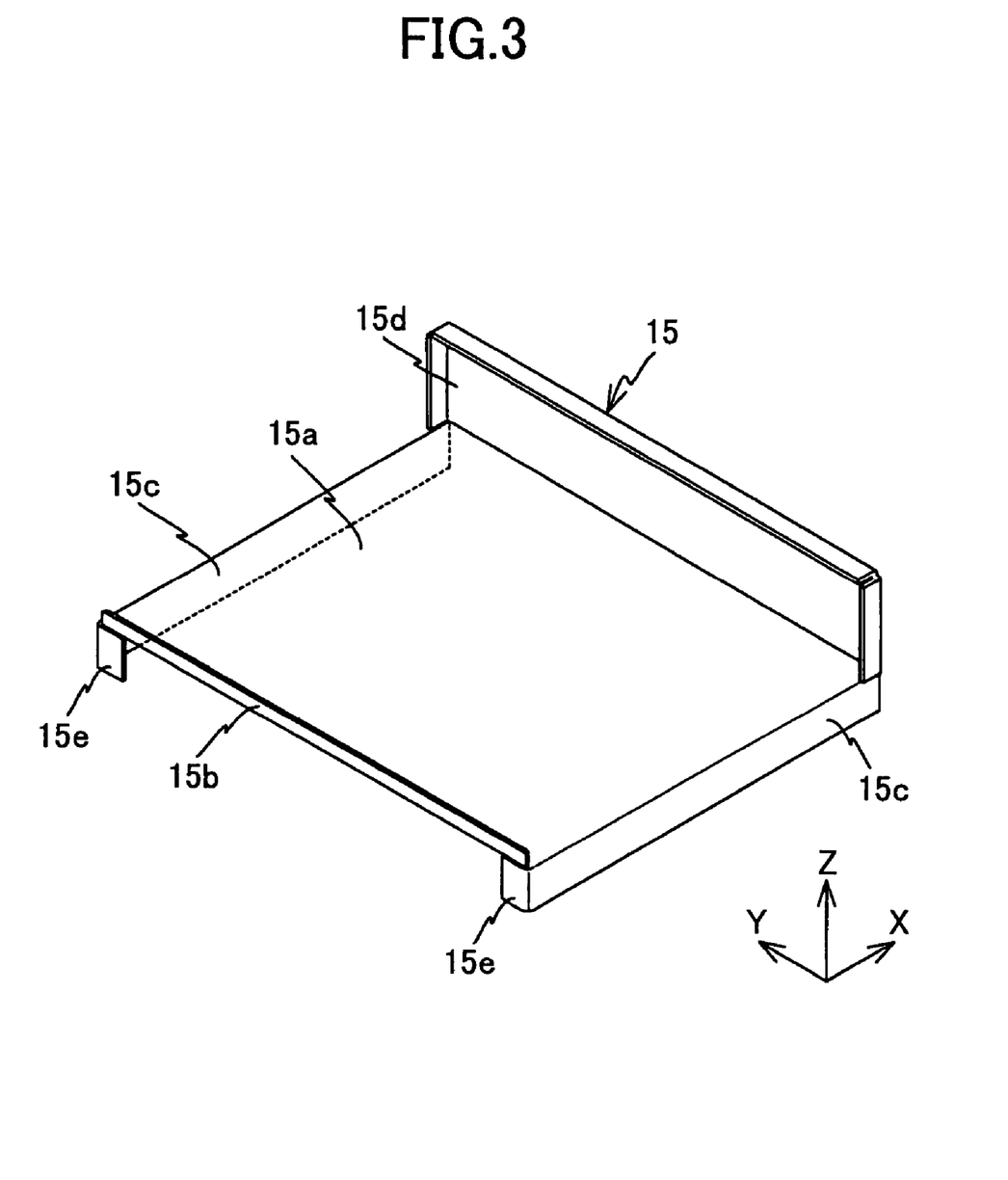
FIG. 3 is a perspective view of a dividing member.

FIG. 3 is a perspective view of the dividing member 15. The dividing member 15 is fabricated by performing sheet metal processing on a steel plate, for example. As shown in FIG. 3, the dividing member 15 includes a substantially square-shaped partition part 15a; a pair of frames 15c provided one along each of the +Y and the −Y edges on the bottom face of the partition part 15a and extending lengthwise in the X axis direction; a frame 15b provided along the −X edge on the top face of the partition part 15a and extending lengthwise in the Y axis direction; and a back wall 15d provided along the +X edge on the top face of the partition part 15a and extending lengthwise in the Y axis direction. A pair of substantially square-shaped guides 15e is provided in corners formed between the −X ends of the frames 15c and the −X edges of the partition part 15a, in such a manner that the guides 15e are formed substantially in the same plane as the frame 15b.

Figure 4:
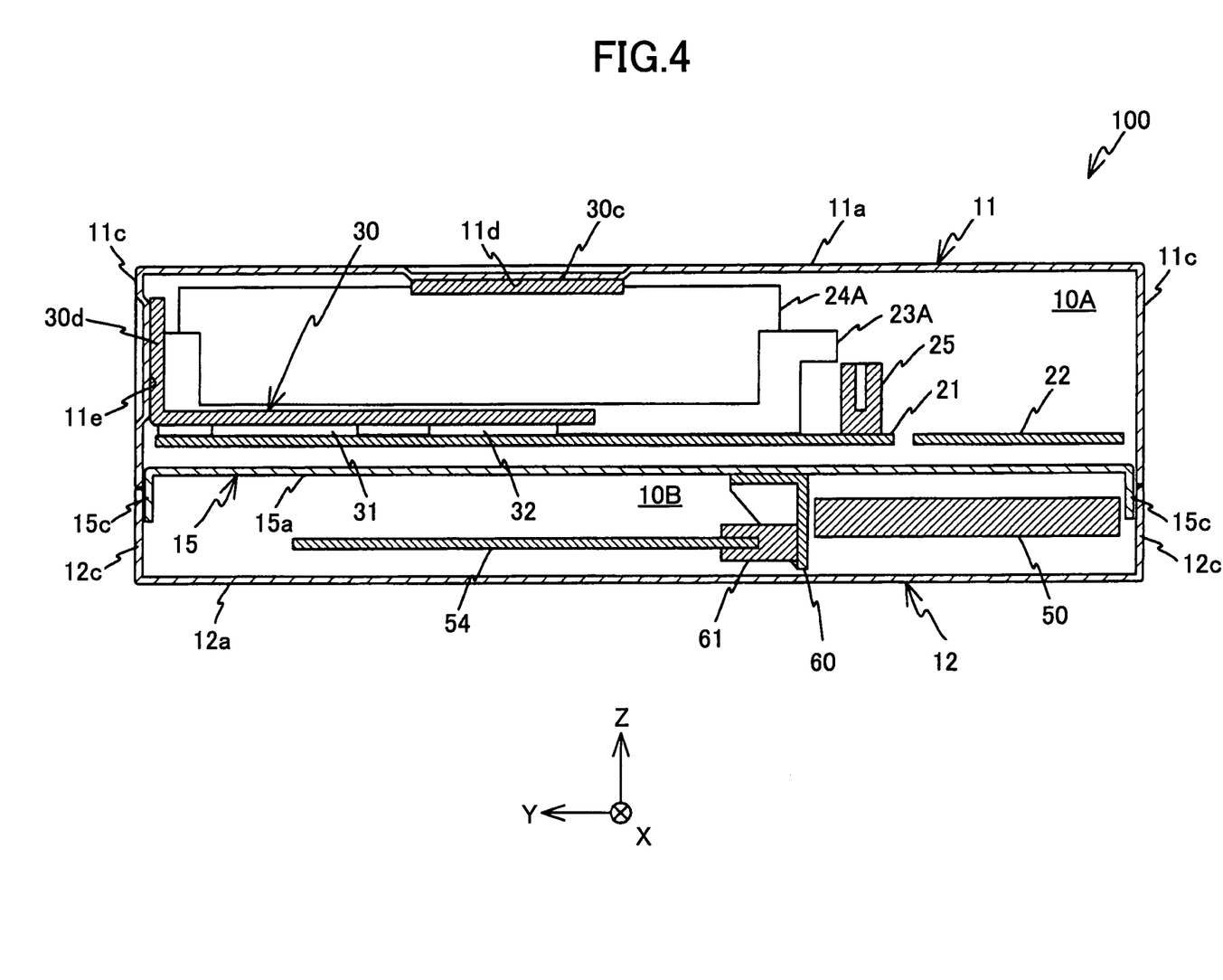
FIG. 4 is a cross-sectional view taken along line A-A of the information processing apparatus shown in FIG. 1.
Figure 5:
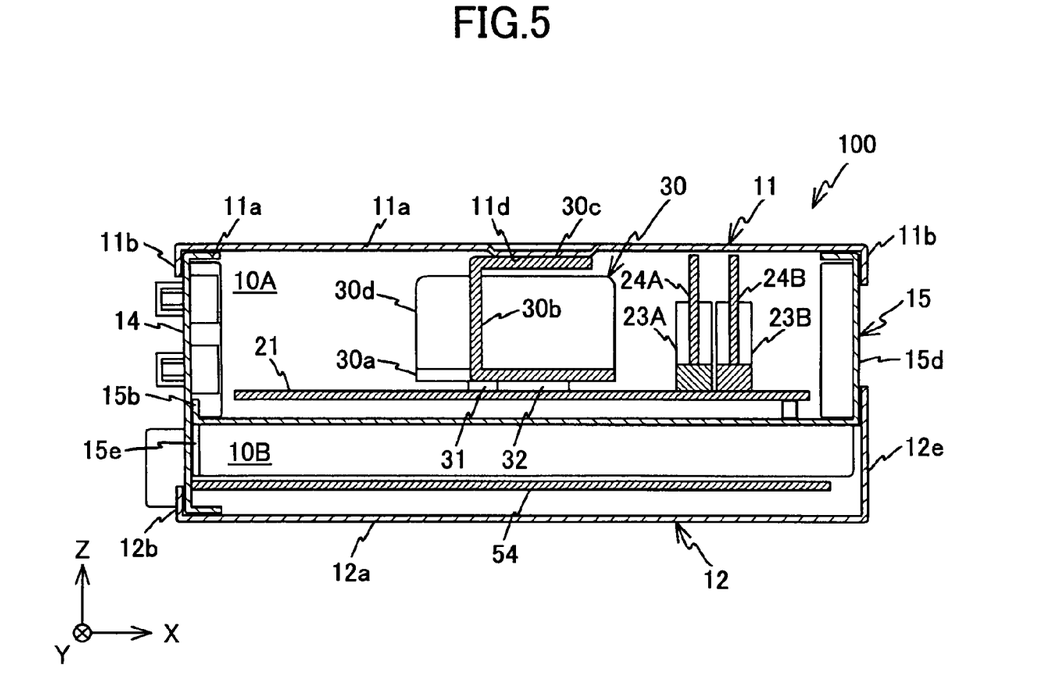
FIG. 5 is a cross-sectional view taken along line B-B of the information processing apparatus shown in FIG. 1.
Figure 6:
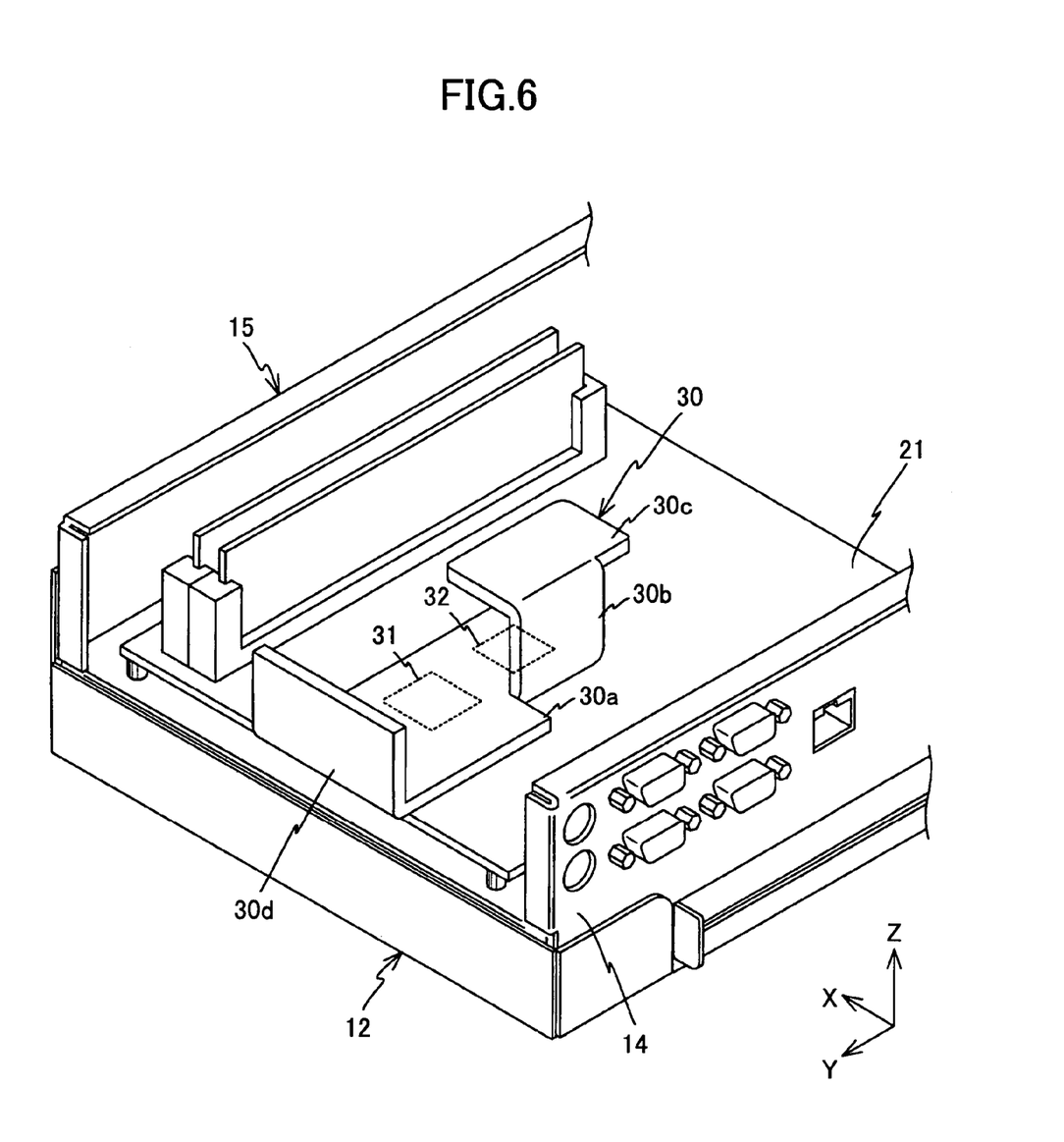
FIG. 6 is a perspective view of parts surrounding a radiating member.

FIG. 4 is a cross-sectional view taken along line A-A of the information processing apparatus 100 shown in FIG. 1 and FIG. 5 is a cross-sectional view taken along line B-B of the information processing apparatus 100 shown in FIG. 1. Referring to FIGS. 2 and 5, the upper cover 11, the lower cover 12, the front panel 14, and the dividing member 15 are arranged in such a manner that the top edge of the front panel 14 and the top edge of the back wall 15d of the dividing member 15 have the same height. Specifically, the inner face of the front panel 14 (face on +X side) is fixed to the frame 15b and the guides 15e of the dividing member 15 with not-shown screws. Referring to FIGS. 2, 4, and 5, the upper cover 11 is fixed on top of the front panel 14 combined with the dividing member 15 with not-shown screws, in such a manner that the pair of engaging parts 11b engages the top edge of the outer face (face on the −X side) of the front panel 14 and the top edge of the outer face (face on the +X side) of the back wall 15d of the dividing member 15, and the inner faces of the side walls 11c contact the frames 15c of the dividing member 15. The lower cover 12 is fixed with not-shown screws in such a manner that the engaging part 12b engages the bottom edge of the outer surface of the front panel 14 and the side walls 12c and the back wall 12e contact the frames 15c and the back wall 15d of the dividing member 15.

Referring to FIGS. 4 and 5, the upper cover 11, the lower cover 12, the front panel 14, and the back wall 15d of the dividing member 15 form an internal space for accommodating electrical components used in the information processing apparatus 100. The partition part 15a of the dividing member 15 divides the internal space into a first space 10A above the partition part 15a and a second space 10B beneath the partition part 15a.

A description is given of arrangements of the electrical components accommodated in the above-described first space 10A. As shown in FIG. 2, the first space 10A accommodates: a motherboard 21 provided with plural electrical components such as a CPU 31, a chip set 32, memories 24A, 24B inserted in slots 23A, 23B, and a PCI card slot 25; a substrate 22 that is a rectangular plate on which plural electrical components are mounted on both sides thereof; and a radiating member 30 for transferring the heat emitted from the CPU 31 and the chip set 32 mounted on the motherboard 21 to the upper cover 11.

The motherboard 21 is a general-purpose motherboard that complies with the ATX specification, typically employed in personal computers. The motherboard 21 is supported by plural supporting members 40 provided on the top face of the partition part 15a of the dividing member 15 so as to be spaced apart by a predetermined distance from the partition part 15a and in parallel with the top face of the partition part 15a. The substrate 22 is supported by the supporting members 40, arranged on the −Y side of the motherboard 21, and extending lengthwise in the X axis direction.

The radiating member 30 is fabricated by performing sheet metal processing on an aluminum plate or a copper plate that is a several millimeters thick. As shown in an enlarged view of FIG. 6, the radiating member 30 has an L-shaped base part 30a including a first section and a second section. The first section is wider in the X axis direction than the second section. The radiating member 30 also includes a first radiating part 30d formed on the +Y edge of the top face of the first section extending lengthwise in the X axis direction, and a second radiating part 30c supported above the second section of the base part 30a by a supporting part 30b formed on the −X edge of the top face of the second section, which second radiating part 30c extends lengthwise in the Y axis direction.

The radiating member 30 having the above configuration is fixed to the motherboard 21 in such a manner that the bottom face of the first section and the bottom face of the second section of the base part 30a respectively contact the CPU 31 and the chip set 32 mounted on the motherboard 21 and the part corresponding to the longer portion of the L shape is parallel with the Y axis. As shown in FIGS. 4 and 5, the outer face of the first radiating part 30d of the radiating member 30 is fixed with screws in contact with the protruding part 11e formed on the side wall 11c of the upper cover 11, and the top face of the second radiating part 30c is fixed with screws in contact with the protruding part 11d formed on the top plate 11a of the upper cover 11. In order to fix the radiating member 30, it is possible to use heat sink fixing holes provided beforehand on the motherboard 21.

Figure 7:
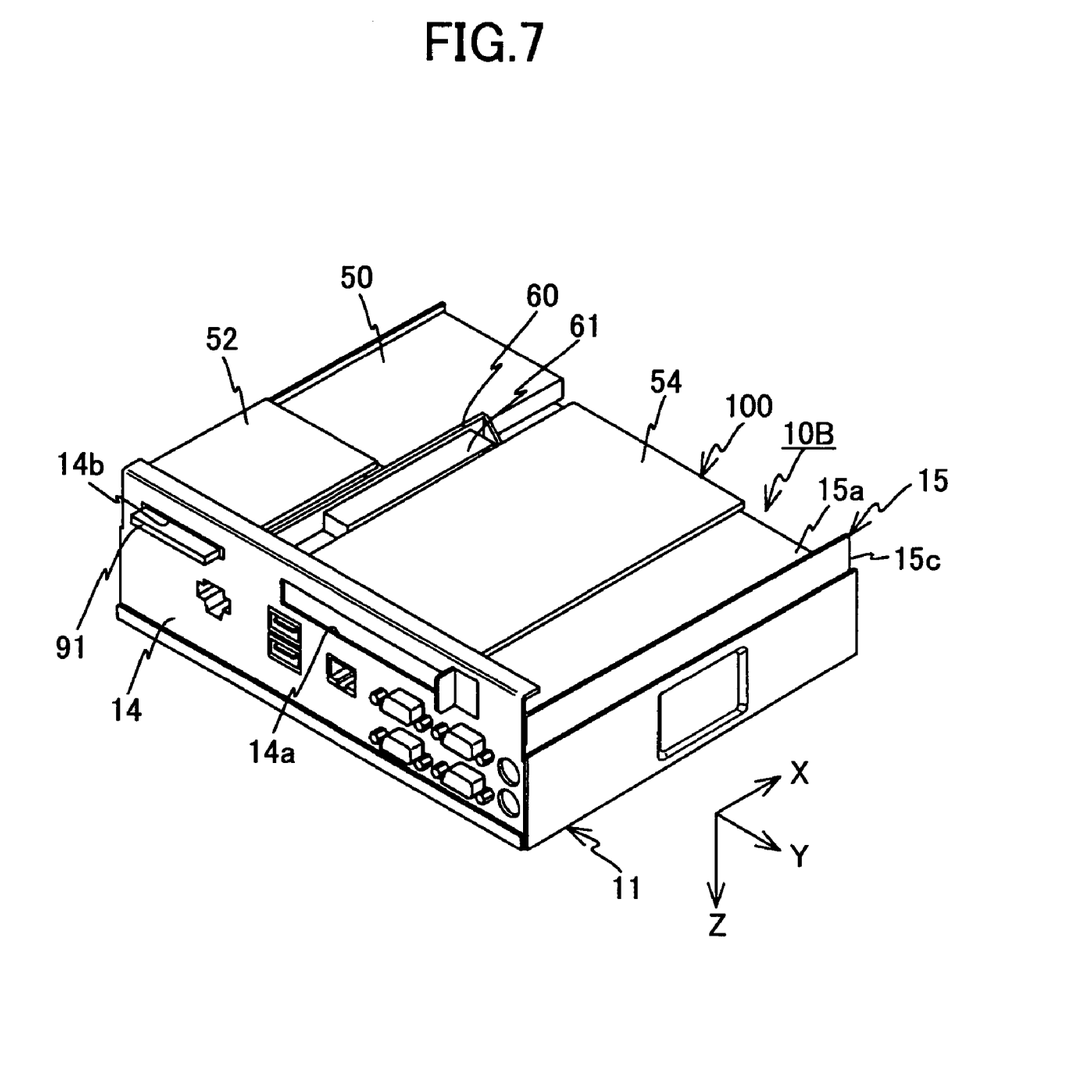
FIG. 7 is another perspective opened up view of the information processing apparatus.

Next, a description is given of arrangements of the electrical components accommodated in the second space 10B with reference to FIG. 7. FIG. 7 is a perspective view of the information processing apparatus 100 viewed from underneath (−Z side) when the lower cover 12 is removed. As shown in FIG. 7, the second space 10B includes a hard disk drive 50, a substrate 52 with a slot for inserting the CF card 91, and a PCI card 54.

The hard disk drive 50 is a general-purpose hard disk drive typically used in personal computers. The hard disk drive 50 is supported by a not-shown supporting member provided in the corner at the +X edge and the −Y edge on the bottom face of the partition part 15a (the face on the −Z side of the partition part 15a) in such a manner that the hard disk drive 50 extends lengthwise in the X axis direction.

The substrate 52 is arranged on the −X side of the hard disk drive 50. When the CF card 91 is inserted in the insertion opening 14b provided on the front panel 14, the CF card 91 is inserted into a slot of the substrate 52 in such a manner that the information processing apparatus 100 is electrically connected with the CF card 91.

The PCI card 54 is a general-purpose expansion card. The PCI card 54 is inserted through the insertion opening 14a in such a manner that a terminal provided on the −Y edge of the PCI card 54 is inserted into a PCI card slot 61 supported by a supporting member 60. The PCI card slot 61 is electrically connected with the PCI card slot 25 mounted on the motherboard 21 by a not-shown cable. Accordingly, when a terminal of the PCI card 54 is inserted in the PCI card slot 61, the PCI card 54 is electrically connected with the information processing apparatus 100.

As described above, in the information processing apparatus 100 according to the present embodiment, an internal space for accommodating electrical components used in the information processing apparatus 100 is formed by the upper cover 11, the lower cover 12, the front panel 14, and the back wall 15d of the dividing member 15. The partition part 15a of the dividing member 15 divides the internal space into the first space 10A and the second space 10B. The first space 10A accommodates high-power consuming and high-heat emitting components such as the CPU 31 and the chip set 32 and the motherboard 21 on which high-heat resistant electrical components are mounted. The second space 10B accommodates low-heat resistant electrical components such as the hard disk drive 50, the PCI card 54, the substrate 52 for the CF card 91, and the CF card 91. Heat emitted from the electrical components accommodated in the first space 10A is primarily transferred outside instead of being transferred to the second space 10B. Specifically, heat sinks are realized by the partition part 15a of the dividing member 15 dividing the internal space into the first space 10A and the second space 10B and the upper cover 11, etc., and therefore, the heat from the first space 10A is eventually transferred outside. Accordingly, it is possible to reduce the heat being transferred to the second space 10B.

The primary heat emitting sources of the information processing apparatus 100 are the CPU 31 and the chip set 32 mounted on the motherboard 21. This heat generated by the CPU 31 and the chip set 32 is transferred to the upper cover 11 by the radiating member 30 fixed on the motherboard 21, and is eventually transferred outside from the upper cover 11. The information processing apparatus 100 primarily has two heat sinks, i.e., the dividing member 15 acting as one heat sink and the radiating member 30 and the upper cover 11 acting as another heat sink. Accordingly, the heat can be efficiently transferred without providing a cooling fan in the housing of the information processing apparatus 100. As a result, the cooling efficiency can be enhanced without increasing the size of the apparatus. Furthermore, because a cooling fan is not required, there is no need to provide a suction hole or an exhaust hole in the upper cover 11. As a result, a dust-proof structure is easily realized, so that operations of the information processing apparatus 100 can be stably performed regardless of the environment in which the information processing apparatus 100 is installed.

In the information processing apparatus 100 according to the present invention, a motherboard complying with the ATX specification is employed as the motherboard 21. Heat emitted from the CPU 31 and the chip set 32 mounted on the motherboard 21 is transferred outside with the radiating member 30 and the upper cover 11 acting as heat-sinks. As illustrated in the example shown in FIG. 2, on a motherboard complying with the ATX specification, a memory inserted in a slot is usually arranged near the CPU 31 and the chip set 32. Because interference would occur between the memory and the housing, the CPU 31 and the chip set 32, etc., cannot be arranged near walls of the housing. For this reason, it is difficult to use the housing as a heat sink when a motherboard complying with the ATX specification is employed. However, the information processing apparatus 100 according to the present embodiment is provided with the radiating member 30, and therefore, a general-purpose motherboard can be employed as the motherboard 21. Thus, costs of the apparatus are prevented from increasing.

Heat generated by the CPU 31 mounted on the motherboard 21 is primarily transferred to one of the side walls 11c of the upper cover 11 via the first radiating part 30d of the radiating member 30, and then eventually transferred outside. Heat generated by the chip set 32 mounted on the motherboard 21 is primarily transferred to the top plate 11a of the upper cover 11 via the second radiating part 30c of the radiating member 30. Accordingly, the heat emitted from the motherboard 21 is transferred outside from different surfaces of the upper cover 11, thus enhancing the cooling efficiency in the first space 10A.

In the information processing apparatus 100 according to the present invention, the second space 10B accommodates electrical components (hereinafter simply referred to as "replacement parts") that need to be replaced or require maintenance periodically, such as the hard disk drive 50 and the PCI card 54. Accordingly, as shown in the example of FIG. 7, the lower cover 12 can be removed so that only the second space 10B is exposed. This means that it is possible to expose only the replacement parts and not expose the precision equipment such as the motherboard 21. Thus, it is possible to prevent the motherboard 21 from being damaged when the replacement parts are being replaced and prevent parts such as screws from being lost in the first space 10A.

In the above embodiment, the radiating member 30 includes the first radiating part 30d and the second radiating part 30c. However, the present invention is not limited thereto. Separate radiating members can be provided for the CPU 31 and the chip set 32.

If the CPU 31 generates only a small amount of heat, the radiating member 30 can be omitted. If the CPU 31 generates a large amount of heat, a larger radiating member can be employed. Furthermore, a cooling mechanism such as a cooling fan can be used together with the radiating member 30.

The electrical components accommodated in the information processing apparatus 100 are not limited to those described in the above embodiment. For example, an SD memory card can be employed instead of the CF card 91, or other electrical components can be included.

In the above embodiment, the information processing apparatus 100 is installed in a horizontal manner; however, the present invention is not limited thereto. The information processing apparatus 100 can be installed in a vertical manner as a matter of course.

The present invention is not limited to the specifically disclosed embodiment, and variations and modifications may be made without departing from the scope of the present invention.

The present application is based on Japanese Priority Patent Application No. 2006-168418, filed on Jun. 19, 2006, the entire contents of which are hereby incorporated by reference.

What is claimed is:

1. An information processing apparatus comprising:
   a central processing unit;
   a substrate on which the central processing unit is mounted;
   a housing configured to form a space for accommodating the substrate;
   a dividing member configured to divide the space into a first space for accommodating the substrate and a second space other than the first space; and
   a plurality of electrical components comprising at least one high-heat emitting component other than the central processing unit;
   wherein the high-heat emitting component is accommodated in the first space; and
   wherein the dividing member comprises a radiating plate configured to transfer, to the housing, heat emitted from at least one of the central processing unit and the high-heat emitting component.

2. The information processing apparatus according to claim 1, wherein: the high-heat emitting component comprises a chip set.

3. The information processing apparatus according to claim 1, wherein: the electrical components comprise at least one replacement part that needs to be replaced; and the replacement part is accommodated in the second space.

4. The information processing apparatus according to claim 3, wherein: the replacement part comprises at least one of a hard disk and a peripheral component interconnect card.

5. The information processing apparatus according to claim 1, further comprising: a radiating member configured to transfer, to the housing, heat emitted from at least one of the central processing unit and the high-heat emitting component.

6. An information processing apparatus comprising:
   a central processing unit;
   a substrate on which the central processing unit is mounted;
   a housing configured to form a space for accommodating the substrate;
   a dividing member configured to divide the space into a first space for accommodating the substrate and a second space other than the first space; and
   a plurality of electrical components comprising at least one high-heat emitting component other than the central processing unit;
   wherein the high-heat emitting component is accommodated in the first space; and
   the information processing apparatus further comprises a radiating member configured to transfer, to the housing, heat emitted from at least one of the central processing unit and the high-heat emitting component,
   wherein the housing comprises a plurality of surfaces; and
   the radiating member transfers heat emitted from the central processing unit and heat emitted from the high-heat emitting component to different surfaces of the housing.

7. The information processing apparatus according to claim 6, wherein: the high-heat emitting component comprises a chip set.

8. The information processing apparatus according to claim 6, wherein: the electrical components comprise at least one replacement part that needs to be replaced; and the replacement part is accommodated in the second space.

9. The information processing apparatus according to claim 8, wherein: the replacement part comprises at least one of a hard disk and a peripheral component interconnect card.

10. The information processing apparatus according to claim 6, wherein: the dividing member comprises a radiating plate configured to transfer, to the housing, heat emitted from at least one of the central processing unit and the high-heat emitting component.

* * * * *